United States Patent [19]

Class et al.

[11] Patent Number: 4,842,703

[45] Date of Patent: Jun. 27, 1989

[54] MAGNETRON CATHODE AND METHOD FOR SPUTTER COATING

[75] Inventors: Walter H. Class, W. Newbury; James F. Smith, Haverhill, both of Mass.

[73] Assignee: Eaton Corporation, Cleveland, Ohio

[21] Appl. No.: 159,318

[22] Filed: Feb. 23, 1988

[51] Int. Cl.$^4$ .................................. C23C 14/34
[52] U.S. Cl. ........................... 204/192.12; 204/298
[58] Field of Search ............... 204/192.12, 298 SG

[56] References Cited

U.S. PATENT DOCUMENTS

| | | | |
|---|---|---|---|
| 2,146,025 | 11/1936 | Penning | 204/192.12 |
| 3,884,793 | 5/1975 | Penfold et al. | 204/298 |
| 4,162,954 | 7/1979 | Morrison | 204/298 |
| 4,282,083 | 8/1981 | Kertesz et al. | 204/298 |
| 4,401,539 | 8/1983 | Abe et al. | 204/192.13 |
| 4,417,968 | 11/1983 | McKelvey | 204/192.12 |
| 4,422,916 | 12/1983 | McKelvey | 204/192.12 |
| 4,428,816 | 1/1984 | Class et al. | 204/298 |
| 4,444,643 | 4/1984 | Garrett | 204/298 |
| 4,457,825 | 7/1984 | Lamont | 204/298 |
| 4,472,259 | 9/1984 | Class et al. | 204/298 |
| 4,515,675 | 5/1985 | Kieser et al. | 204/298 |
| 4,569,746 | 2/1986 | Hutchinson | 204/298 |
| 4,595,482 | 6/1986 | Mintz | 204/298 |
| 4,604,180 | 8/1986 | Hirukawa et al. | 204/298 |
| 4,622,121 | 11/1986 | Wegmann et al. | 204/298 |
| 4,627,904 | 12/1986 | Mintz | 204/298 |
| 4,747,926 | 5/1988 | Shimizu et al. | 204/298 |

FOREIGN PATENT DOCUMENTS 61-183467 8/1986 Japan .................................. 204/298
62-230969 10/1987 Japan .................................. 204/298

OTHER PUBLICATIONS

L. Holland "Vacuum Deposition of Thin Films", pp. 152-156, John Wiley & Sons (New York) 1958.

L. Maissel & R. Glang "Handbook of Thin Film Technology", pp. 1-56 to 1-59, McGraw Hill Book Co. (New York) 1970.

Class & Hieronymi "The Measurement and Sources of Substrate Heat Flux . . . ", *Solid State Tech.* pp. 55-61, Dec. 1982.

Helmer & Wickersham "Pressure Effects in Planar Magnetron Sputter Decomposition", pp. 408-412 *Journal of Vacuum, Science & Technology A*, vol. 4, No. 3, Part 1, May/Jun. 1986.

*Primary Examiner*—Aaron Weisstuch
*Attorney, Agent, or Firm*—Watts, Hoffmann Fisher & Heinke

[57] ABSTRACT

A magnetron sputter coating assembly. The assembly includes a concave consumable target spaced closely to a substrate coating position. Coating uniformity is maintained by controlling ion formation between the substrate and the target. This is accomplished with a plurality of ferromagnetic pole pieces and two individually energizable current carrying coils. The consumable target may be constructed in two segments. A first inner segment defines a generally planar target base parallel to the substrate surface to be coated. A second, outer target segment has a coating surface that forms an angle with respect to the substrate surface.

12 Claims, 9 Drawing Sheets

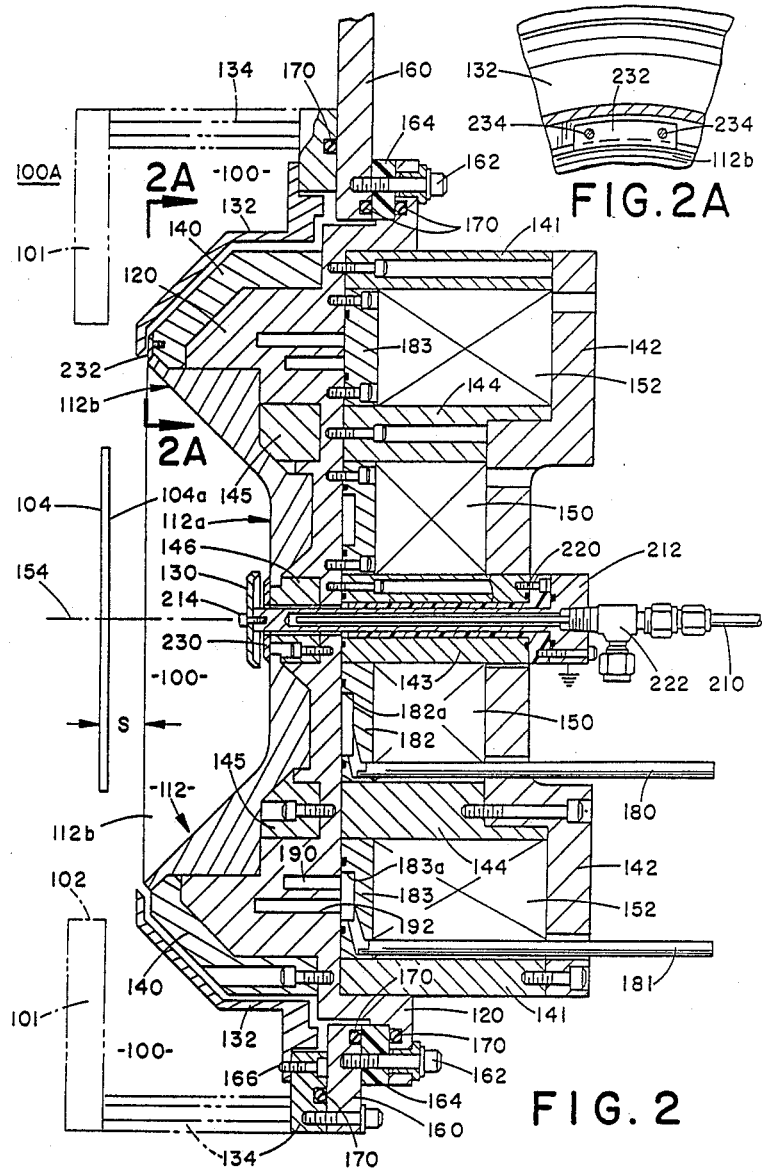

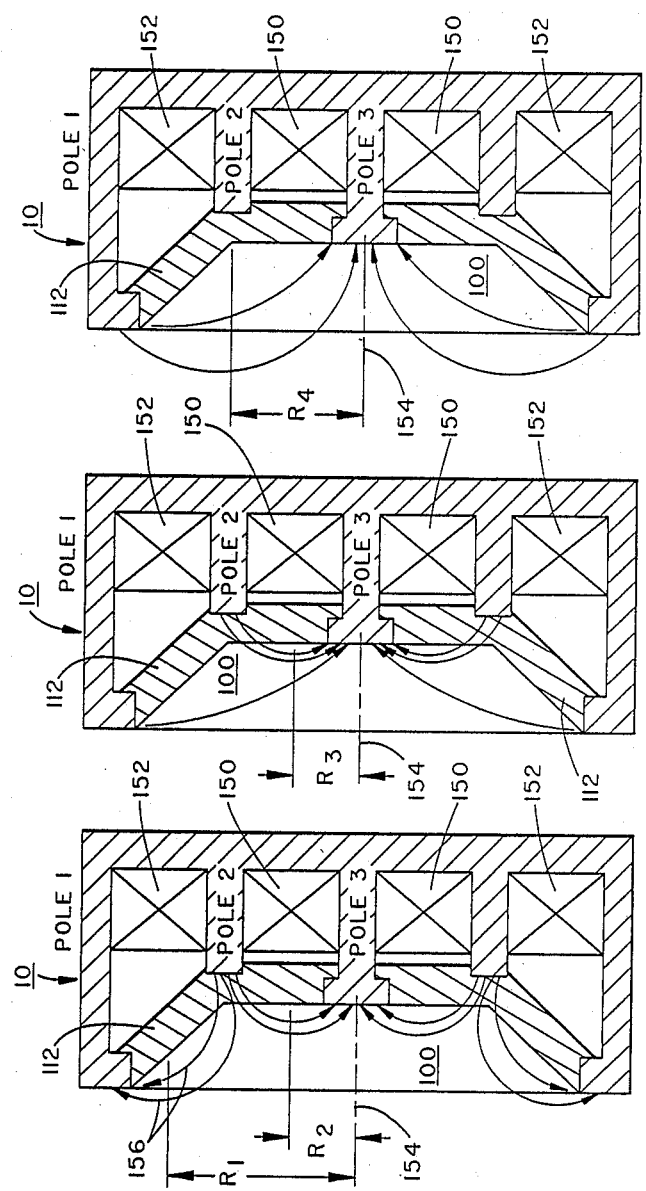

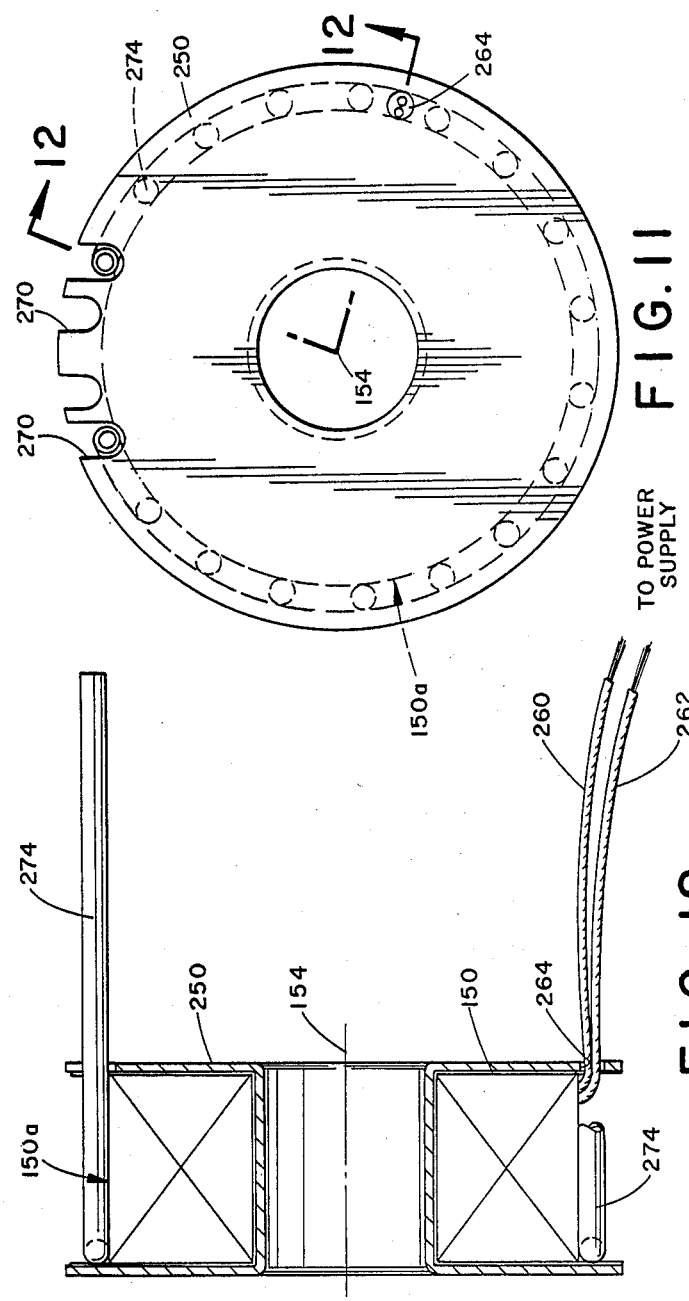

MAGNETRON CATHODE AND METHOD FOR SPUTTER COATING

TECHNICAL FIELD

The present invention relates to a magnetron sputtering cathode having improved transfer efficiency and target utilization which is suitable for the coating of flat disk-shaped substrates such as silicon wafers or rigid magnetic disks.

BACKGROUND

Sputter coating is a process where atoms of a solid target are ejected by the bombardment of energetic ions onto the target. The collection of these sputtered atoms on a nearby object, called a substrate, coats the substrate with the target material. The source of the bombarding ions is commonly a gas discharge, where collisions between electrons and neutral gas atoms results in the generation of electron and gas ion pairs, the ions having a positive charge. A negatively charged electrode (cathode) placed in the gas discharge attracts the positive ions causing the ion bombardment responsible for sputtering.

The target is consumed by the sputtering process and requires periodic replacement. A cathode assembly supports the target, provides water cooling, sets up a magnetic field in the region of the gas discharge and shields non-target portions of the cathode from unwanted ion bombardment. Most sputtering systems operate with the target at a negative potential, with a grounded metal chamber acting as an anode. The gas discharge is usually made from argon gas at pressures in the range of 1 to 20 millitorr. (Atmospheric pressure is 760 Torr).

Argon is the gas of choice because of its chemical inertness, relatively large atomic mass, and relatively low cost. Electrical gas discharges can be achieved with any gas, but if a chemically reactive gas is chosen, it will react with atoms sputtered from the target to yield a coating which is the reaction product of the two constituents. When this is intentionally done, the process is termed reactive sputtering. An example of reactive sputtering is the sputtering of a titanium target in a nitrogen-argon gas mixture to yield a coating of titanium nitride. Residual atmospheric gas contaminants present in the gas discharge will also react with the coating material resulting in its contamination. Since this is to be avoided, many sputtering systems are evacuated in the region of the discharge to pressure levels of $1 \times 10^{-7}$ Torr or less prior to introduction of the ion providing gas.

Another method of minimizing coating contamination is achieved by increasing the coating rate. This method is effective because at a given constant residual gas pressure, the degree of coating purity is directly proportional to coating rate. Thus, a doubling of the coating rate has the same effect as halving the residual gas pressure.

Many sputter coating applications require that the temperature of the substrate be regulated to achieve optimum coating quality. The substrate support is accordingly provided with a heating and/or cooling means. Similarly, coating quality can also be improved if the substrate is subjected to a moderate negative bias with regard to the gas discharge. This method, termed bias sputtering, causes positive argon ion bombardment of the coating during its growth, which bombardment can have beneficial effects on coating porosity, stress and conformality.

The sputtering process may be used as a material removal or surface cleaning method. For this use the discharge chamber is not equipped with a sputtering cathode. Instead, the object to be cleaned or etched becomes part of the primary system cathode. The ensuing ion bombardment of the substrate removes surface contaminants and may also remove some of the bulk atoms of the object. This process is termed sputter-etching and is frequently used in a sputtering system as a preparatory step prior to the deposition of target material onto a substrate.

A measure of transport efficiency for a sputter coating target is the fraction of the material sputtered off the target which reaches the substrate that is being coated. Thus, 50% efficiency represents the condition where half the material which sputters off the target due to ion bombardment coats the substrate. The remaining sputtered material usually coats other parts of the sputtering process chamber. There are many reasons why it is very desirable to increase transport efficiency.

Firstly, many sputter coating materials are costly and since the unused sputtered material cannot effectively be recovered, this represents a significant additional coating cost.

Secondly, the unused sputtered material usually coats other sputter chamber components where, after a time, it causes problems such as particulate generation or electrical shorting of insulators. Consequently, the coating process must be interrupted for purposes of removing this extraneous material. Such maintenance typically requires that many hours elapse before coating can resume and therefore also represents a significant operating cost.

Thirdly, typical target volumes, being limited by cathode design constraints, require that the sputter coating process be interrupted for purposes of spent target replacement. Here again, the coating process is disrupted.

Fourthly, the deposition rates achievable with sputtering processes are inherently low, and are frequently limited by the size and cost of available power supplies, or limited by heat dissipation factors inherent in cathode designs. These factors limit the rate at which material can be sputtered off the target source. Thus, an improvement in transport efficiency allows for an improvement in coating rate, within the above limitations and consequently results in coating process productivity improvements.

Fifthly, sputter coating quality is frequently impaired by the incorporation of atmospheric gases such as oxygen, nitrogen and water vapor. This gas incorporation rate is dependent upon the relative arrival rates of gas atoms versus the sputtered atoms at the substrate. A high sputtered atom arrival rate therefore favors increased coating purity.

The low rate of arrival of sputtered atoms requires that very stringent measures be taken in the design, construction, and vacuum pumping of the sputtering apparatus to assure lower atmospheric gas impurity arrival rates. These measures lead to equipment cost increases, and usually also imply additional maintenance and operating costs. In many instances sputter coating quality is limited by the available state-of-the-art vacuum technology and practice.

U.S. Pat. Nos. 4,428,816 to Class et al and 4,472,259 to Class et al disclose magnetron sputtering cathodes having improved transfer efficiency. Such cathodes are suitable for the coating of substrates only when the substrate is caused to travel past the cathode in a linear fashion. Such cathodes are suitable therefore only in a sputtering apparatus which includes a scanning mechanism. The absence of such substrate motion, results in unacceptable thickness non-uniformity of the substrate coating.

There are reasons why the requirement for substrate translational motion is a disadvantage. First among these is the fact that many coating processes, including "planarized" aluminum coatings require close control of substrate temperature, and in addition require the application of radio frequency (RF) substrate bias power during the coating process. The application and control of substrate heating combined with the requirements of Rf power plus translation pose serious design and handling problems which increase equipment cost and degraded performance reliability.

The achievement of coating thickness uniformity combined with high transfer efficiency is difficult. This is because magnetron discharges are inherently non-uniform in their degree of ionization (plasma density). Consequently, the rate at which material is emitted from the surface of the sputtering target is also non-uniform, tending to be localized in linearly continuous regions of the target known as "racetrack" regions. As the substrate is brought closer to these racetrack regions, transfer efficiency (the fraction of the target that reaches the substrate) is improved but coating thickness uniformity is impaired.

The deposition profile at a substrate that is being coated by material sputtered from a racetrack pattern of a planar target can be modeled using the Knudsen cosine law. The cosine law states that the maximum emission of sputtered material from an emitting surface occurs along the direction which is perpendicular to the surface. The emission in any direction which is inclined at an angle, $\theta$, with regard to the surface perpendicular, is less than this maximum emission by the cosine of the angle $\theta$. For flat, disk-shaped substrates, the obvious choice for a coating source is a cathode which yields a ring shaped racetrack which is the emitting source of the coating material. Thus, the sputtering target can be a planar disk, with a circular racetrack on it, and the substrate placed nearby, with its surface parallel to the target plane, and its center coaxial with the centerline of the racetrack. The deposition properties of such ring emitting sources have been documented in the literature. See, for example, L. Holland, *Vacuum Deposition of Thin Films*, Chapman & Hall Ltd., London, 1963, pages 152-156 and L. Massel and R. Glang, *Handbook of Thin Film Technology*, McGraw-Hill, New York, 1970, pages 1-56 to 1-59.

These studies show that there is an optimum spacing between source and substrate which yields the greatest deposition rate uniformity. For separations greater than this optimum, the deposition rate is greatest at the point where the axial centerline of the target ring intercepts the substrate plane. From this maximum, the rate decreases monotonically with radial distance from the central point, yielding a dome-shaped deposition pattern. For source to substrate separation less than the optimum the deposition pattern assumes a saddle-like shape which shows a maximum at the substrate radial position equal to the ring-source radius. This maximum becomes more pronounced as the source to substrate distance is further decreased.

The practical application of these principles to a ring shaped magnetron source requires that the zone of uniform deposition be approximately 10% greater than the substrate diameter. For these reasons, the achievement of uniform deposition on a substrate having a radius $R_s$ requires that the racetrack radius be approximately 1.1 $R_s$ and the source to substrate distance be equal to approximately 1.3 $R_s$. Such sources typically have a transfer efficiency of 15 to 18%. Such sources are therefore limited in transfer efficiency because any attempt at decreasing the source to substrate distance, results in a non-uniform, saddle-shaped deposition profile.

Another limitation associated with this magnetron sputtering configuration is the manner by which progressive erosion of the target influences both the coating thickness profile as well as the utilization efficiency of the target. It is known that the localized ion bombardment associated with the magnetron geometry causes a target surface to be locally sputtered away. Thus, the target surface develops a localized groove in the racetrack region. As sputtering progresses, this groove becomes progressively narrower and deeper. As a consequence, the angular range over which sputtered atoms leave the target surface is narrowed i.e., becomes "over cosine". Thus, the coating rate at the substrate progressively increases for those portions of the substrate immediately adjacent to the racetrack region of the target and progressively decreases elsewhere. The resulting progressive coating thickness non-uniformity limits the useful coating life of the target, with the attendant costs associated with target replacement.

This problem is accentuated by a reduction in target to substrate distance. This arises because, at the greater substrate distance, collisions between neutral gas atoms and the sputtered atoms have the effect of broadening the angular range over which the sputtered atoms travel after leaving the target surface. This gas scattering has the effect of compensating for the deposition profile narrowing associated with a deepening target racetrack groove. As the target to substrate distance decreases, the opportunity for gas also decreases, thereby accentuating the aforementioned problems of film thickness non-uniformity and target utilization.

Another undesirable aspect of the development of a deep and narrow racetrack groove is that this causes the target to become eroded through its useful thickness before an optimum volume of the target material is used to achieve substrate coating. Consequently, more frequent target replacement with its attendant cost is mandated. For these reasons, a means of achieving a broad target erosion pattern is desirable.

Another factor which enters in the practical application of ring shaped magnetron sputtering sources is related to the conformality of the coating. Semiconductor wafer substrates are not flat when viewed on a microscopic scale. Instead, they have micrometer sized features such as steps, and square sided holes which have a depth equal to the lateral dimensions. One example would be a square hole measuring one micrometer in length and width and one micrometer in depth. Another example would be a groove measuring one micrometer in width and depth, with a length measured in tens or hundreds of micrometers. There are many reasons why it is desirable that the coating should conformally cover these features, i.e. that the coating thickness at the bottom or side-wall of a step or hole be equal to that at the top. This is a problem with sputter deposition because the majority of sputtered atoms which leave the target travel to the substrate without gas scattering and in a straight line path. Furthermore, most sputtered atoms move only short distances on the substrate surface after arrival. As a consequence, if a given substrate region does not lie on a direct line of sight path to an emitting region of the target, the sputtered atoms from that region of target are shadowed and do not contribute to the build-up of a coating in the given substrate region. Alternatively, some substrate regions may have a broad line of sight view of the target and therefore achieve coating thicknesses which are much greater than the average. As a consequence, the sputter coating of a vertical step can result in a layer which is thick and overhangs the top of the step leaving only a thin coating on the sidewall and bottom of a step. Also, for substrates coated using the ring configuration, it is not unusual to find that a substrate step which faces radially outward experiences a different coating coverage from one which faces radially inward. From this perspective it is desirable that the target emitting region be very broad, thereby affording the greatest possible viewing angle to all substrate sites.

The aforementioned problems have been partially addressed by a variety of methods disclosed in prior issued patents. It has been known for some time that the shape of the magnetic field needed to establish the target racetrack has a direct influence on the width of the racetrack groove. This magnetic field is produced by opposite magnetic poles situated behind or adjacent the target. These cause arch shaped magnetic flux "lines" to emerge from the target in the vicinity of the north magnetic pole, arch over and then reenter the target in the vicinity of the south magnetic pole. Discharge electrons are trapped by the combination of magnetic field and the strongly negative potential of the target surface. This combination of electric and magnetic field also induces a sideways magnetron drift to the electrons. To prevent the loss of these electrons, the arch shaped magnetic field is made to close on itself, thereby forming an endless "tunnel" adjacent to the target face. The discharge is confined in this region and tends to be most highly ionized in those places where the arching magnetic field is substantially parallel to the target face. Accordingly, a highly arched field produces a narrow racetrack, and a gently curved arch produces a desirable broad racetrack. U.S. Pat. No. 4,162,954 to Morrison discusses these target racetrack characteristics. Similarly, U.S. Pat. No. 4,457,825 to Lamont, Jr., discloses this art as applied to a ring source. The '825 patent also discloses the use of a ring shaped target with inward sloping faces like the frustum of a cone. Recalling the cosine law, one might expect such a target to emit more sputtered material radially inward. Accordingly, with such a target one can achieve a closer target-substrate spacing without the uniformity loss associated with the saddle-shaped deposition profile.

The characteristics of such a source are described in an article by J. C. Helmer in the *Journal of Vacuum Science and Technology*, Second Series, Volume 4, Number 3, Part 1, May/June 1986, pages 408-412. At an operating pressure of 6mTorr argon gas, this cathode exhibits a 21.9% transfer efficiency, and yields an aluminum sputter deposition rate of approximately 1800 angstroms per minute at an applied D.C. power of 1563 watts. From the Helmer reference it may be inferred that the useful deposition zone radius, $R_s$, is yielded by a racetrack radius of equal dimension, i.e., $R_s = RR$, and the substrate spacing is approximately, 875 $R_R$. A closer spacing than this causes the familiar saddle shaped deposition profile and deposition uniformity loss.

Another method of achieving a broad erosion pattern on a planar target is disclosed in U.S. Pat. No. 4,444,643 to C. B. Garrett. Here the entire field forming magnet structure is mechanically moved to cause the associated racetrack discharge to continually traverse the target face. The approach has the disadvantage of requiring mechanical motion with the inherent issue of reliability. No substrate spacing is referenced in the patent. Planar magnetron devices of this class are known to require a minimum substrate spacing of 5 cm to 6 cm to minimize electron bombardment of the substrate. (See for example, the article by W. Class and R. Hieronymi, Solid State Technology, December, 1982, pages 55 to 61.) At this spacing a substantial amount of sputtered material is lost from an annular region within 6cm from the target periphery.

Yet another method for achieving a broad erosion pattern is described in U.S. Patent No. 4,401,539 to Abe et al where an auxiliary magnetic field is used to displace the position of a racetrack produced by a primary, field-producing electromagnet. The auxiliary magnetic field is achieved by the use of an electromagnet coil which shares one of the two cylindrical pole pieces of the primary, field-producing electromagnet. The primary, field-producing electromagnet, having cylindrical symmetry, causes a circular racetrack to be generated on the face of a disk-shaped planar target. The activation of a current in the auxiliary magnet field coil, having a polarity opposite to the current in the primary coil causes a reduction in the diameter of the racetrack. This diameter reduction is proportional to the magnitude of the auxiliary coil current. A programmed coil current modulation applied to this auxiliary electromagnet coil permits the achievement of a racetrack having a diameter which synchronously varies with auxiliary coil current. Accordingly, the auxiliary coil current is used to cause a broad erosion pattern on the target as well as to compensate for the coating thickness non-uniformities which develop as target erosion progresses.

The characteristics of this source are:

$R_R = 0.85 R_s$ to $1.0 R_s$ and target-to-substrate spacing is 1.3 $R_s$. No transfer efficiency characteristics are available for this source, but the geometry predicts that it is between 15 and 20%. The primary benefits of this approach reside in improved target utilization and film thickness uniformity.

The aforementioned sources all have disadvantages in film step coverage because of the limited angular range with which sputtered atoms arrive at the substrate. This range is limited by the size of the target erosion zone as well as the separation between substrate and target since, for a given erosion zone width, the angular arrival range varies inversely with the spacing.

U.S. Pat. No. 4,604,180 issued to Y. Hirikawa addresses this by combining two separate concentric ring sources. The inner ring source is achieved on a disk shaped flat target, and the outer ring source is achieved on a target with an inwardly facing surface shaped as the frustum of a cone. The relative sputter emission rate of each ring source is controlled by separately applying D.C. power to each ring source. Alternately, the rings are maintained at a common potential, and the power splitting between ring sources controlled by varying the coil current in the electromagnet.

U.S. Pat. Nos. 4,606,806 to J. Helmer, 4,595,482 and 4,627,904 to D. Mintz and No. 4,569,746 to M. Hutchinson similarly disclose separately powered concentric ring sources, one planar and the other the frustum of a cone, where the magnetic field producing means are two electromagnet coils which couple to a ferromagnetic pole-piece structure. The coils share one pole piece and the coil currents are such that the magnetic flux induced by the coils is always additive in the shared pole piece. As a consequence, two separate magnetron discharges are formed; one adjacent to the planar ring shaped target, and the other adjacent to the conical ring shaped target. Deposition uniformity is achieved by separately adjusting the electrical power to the separate discharges such that at a given substrate spacing, the deposition contributions add to give the desired uniformity.

As revealed in U.S. Pat. No. 4,627,904 to D. Mintz, the power to the outer ring target is five to twelve times greater than that applied to the inner target. As will be shown in the description of the inventive cathode disclosed here, such a power splitting will only give a uniform deposition profile for a substrate radius $R_s$ when the outer ring racetrack radius $R_R$ is of approximately equal radius, and the substrate spacing is approximately equal to 0.875 $R_R$. This is very similar to the configuration described in U.S. Pat. No. 4,457,825 to Lamont Jr. Similar transport efficiencies are therefore predicted. This configuration will not permit extended operation at closer substrate spacing because only limited means is provided for minimization of the associated pair of racetrack grooves, which at a closer spacing would result in a deposition pattern having dual peaks with an intermediate valley associated with the annular non-sputtering region between the inner and outer targets.

Another means of overcoming the shortcomings of a single ring emitting source is disclosed in U.S. Pat. No. 4,622,121 to U. Wegman, et al. Here, again, two separate annular sputtering zones are established and a means provided for adjusting the deposition from each zone in order to achieve deposition uniformity. In the preferred embodiment, this is achieved by electrically isolating and separately powering the two targets. In an alternate embodiment, separate electromagnetic racetrack zones are established, on a target or targets maintained at a common potential, and power division achieved by adjustment of the electromagnetic coil currents.

The preferred embodiment disclosed in the '121 Patent achieves broadening of the racetrack groove by an eccentric motion applied to the field forming permanent magnet structures. The alternate embodiment has no such means. In both embodiments, the outer target has an emitting surface which is vertical or almost vertically disposed relative to the substrate plane. The inner target is planar or almost planar and is oriented in the standard manner with regard to the substrate. This configuration provides a very broad angular arrival range of sputtered atoms to the substrate, which is here limited only to the non-sputtering zones along the axial centerline of the inner target, and the annular non-sputtering region between the inner and outer racetracks. Another limitation of this configuration is associated with the vertical or near vertical orientation of the outer target. This configuration causes an appreciable degree of cross sputtering from one target to another as may be predicted from the cosine law. This configuration also severely restricts the proximity of inner target to substrate. Thus, although transport efficiency is probably high, power efficiency is predictably low because of the high degree of cross sputtering. In addition to reducing power efficiency, cross sputtering has the further disadvantage of causing excessive sputtered material build-up on the non-sputtering regions of each target. Such build-up is a known source of particulate formation as well as a source of electric arcing, which is also deleterious to the quality of the sputtered coating.

Disclosure of the Invention

In view of the aforementioned prior art one object of the present invention is a means of achieving a uniquely broad angular arrival range of sputtered atoms to the substrate. The annular non-sputtering region between two separate concentric discharges is entirely eliminated.

A second object of the invention is the provision of a uniquely close spacing between all target emitting surfaces thereby providing uniquely high transport as well as power efficiency.

An additional object of the invention is a unique non-mechanical means of eliminating racetrack groove formation, thereby achieving excellent target utilization efficiency, and deposition uniformity throughout target life.

A further object of the invention is reduction in sputtered material accumulation on a non-sputtered annular region between separate discharges with attendant reduction in particulate formation and target arcing.

A magnetron sputter coating system constructed in accordance with the invention achieves a transfer efficiency of nearly 40% by use of a substrate to target spacing much less than prior art systems. This spacing is possible without a degradation in coating uniformity due to a control over the target sputtering and more specifically a control over multiple target racetracks.

A preferred magnetron sputter coating system includes a cathode having a support that fixes a specially configured cathode target with respect to a substrate position. A sputter coating target surface faces the substrate position and controlled concentrations of ionizable gas are maintained in a region between the substrate position and the sputter coating target surface.

Gas ions in the region between the substrate position and the target are accelerated to impact the target and eject coating material to coat the substrate. A variable magnetic field is created by multiple electro-magnets which can be controlled to concentrate and move regions of target sputtering. The control over magnetic field between the target and the substrate causes electrons to be confined to specific regions and thereby concentrates gas ionization to those regions.

A preferred target is a bowl shaped concave structure symmetric about an axis perpendicular to the substrate and is preferably used to coat silicon wafers. An inclined outer target wall slopes at a uniform rate toward a generally planar target base. The spacing between this planar base surface and the substrate is less than the diameter of the bowl base and the spacing between the inclined outer target region and the substrate is even less, typically less than $0.5R_R$ where $R_R$ is the maximum racetrack radius.

The target is constructed in one piece or constructed in two pieces to make the target easier to fabricate. For a two piece target the first target piece defines the sloping walls and a second piece defines the planar base. Both pieces are coupled to a support in abutting relation and maintained at the same negative potential.

A plurality of pole pieces are fixed to the cathode relative to the gas discharge zone to help define the target racetracks. The pole pieces and two separately energizable coils set up magnetic fields to focus ion/electron pair formation relative to the target. By controlling coil energization, both its magnitude and its sense, the radii of the racetracks are adjusted.

From the above, it is appreciated that one object of the invention is a magnetron sputter cathode configured to increase cathode utilization, transport efficiency, and power efficiency without sacrificing coating uniformity. This and other objects, advantages, and features of the invention will be understood from a detailed description of one embodiment of the invention which is described in conjunction with the accompanying drawings.

BRIEF DESCRIPTION OF THE DRAWINGS

FIG. 2 is a section view of a magnetron sputter coating cathode assembly;

FIG. 2A is a section view as seen from the plane 2A—2A of FIG. 2;

FIGS. 3–5 are schematic depictions of different magnet coil energization options for controlling target utilization;

FIGS. 11 and 12 are elevation and section views of a coil mounting assembly for supporting an electromagnetic coil.

BEST MODE FOR CARRYING OUT THE INVENTION

Figure 1:
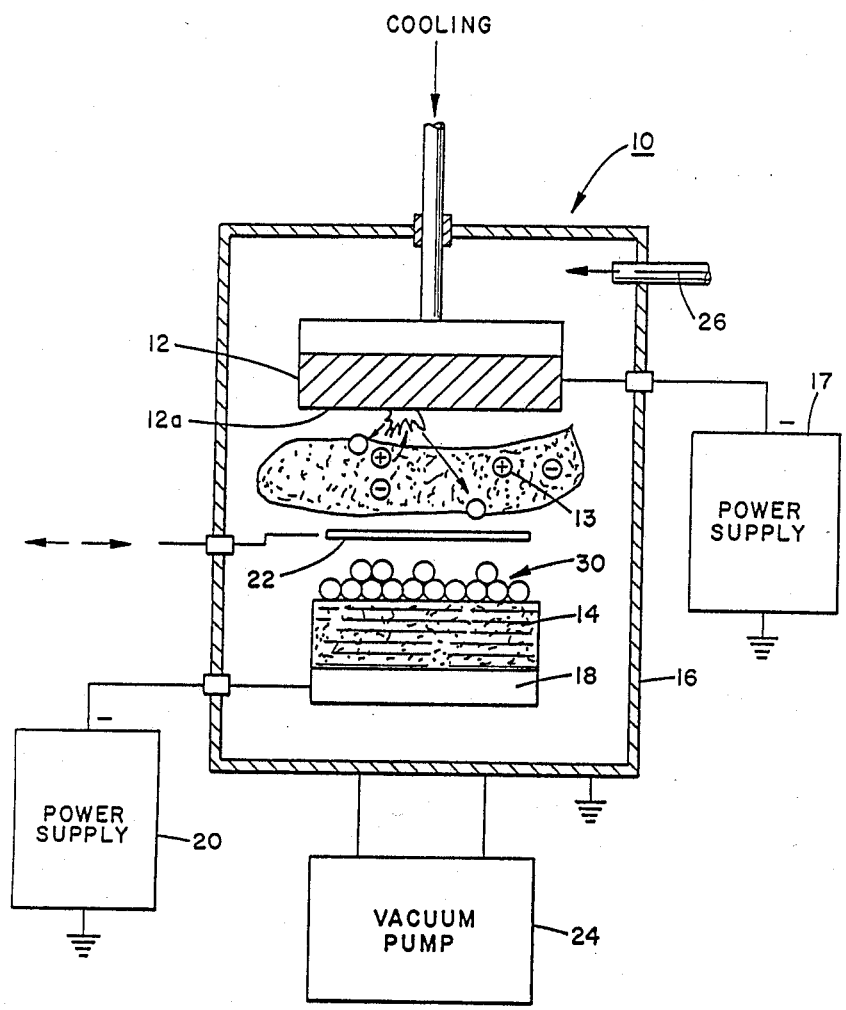
FIG. 1 is a schematic of a prior art sputter coating system.

Turning now to the drawings, FIG. 1 schematically depicts a prior art sputter coating assembly 10 having a consumable target 12 for coating a planar substrate 14 positioned relative the target 12. The target 12 defines a sputtering surface 12a which erodes as gas ions 13 impact the sputtering surface with sufficient energy to eject the target material.

The target 12 and substrate 14 are positioned in a continuously evacuated chamber 16 into which a sputtering gas is continuously fed and monitored in order to dynamically maintain the sputtering pressure. Also shown are a target power supply 17, a substrate holder 18 with its associated power supply 20, and a shutter 22. With this prior art system, a coating process is carried out using the following steps.

1. The system is vented to the atmosphere, and opened to permit the placement of the substrate 14 onto the substrate holder 18. The system shutter 22 is then placed between the substrate and target as shown in FIG. 1.
2. The system is evacuated to a high vacuum level by a pump 24 to minimize the residual atmospheric gases in the chamber, and upon achieving the required vacuum level ($10^{-5}$ to $10^{-7}$ Torr), the sputter gas is introduced via an inlet 26, and its flow regulated to achieve the proper gas pressure ($\sim 10^{-2}$ Torr).
3. With the shutter 22 closed, power is applied to the substrate holder 18, and the ensuing discharge (also called a plasma) is used to clean the substrate 14 of absorbed atmospheric contaminating gases.
4. With the shutter 22 still closed, the power is applied to the sputtering target 12, and adjusted to first clean the target surface, and then increased to cause the ejection of sputtered target atoms.
5. Substrate power is adjusted to the proper bias level.
6. The shutter 22 is opened to allow the timed deposition of target material 30 onto the substrate 14. At the end of this period the shutter is closed, and both target and bias power turned off.
7. The working gas is then turned off, the pumps isolated from the vacuum chamber by means of valves (not shown) and the chamber 16 is vented back to the atmosphere.
8. The coated substrate is removed from the chamber, a fresh uncoated substrate is placed on the holder, and the process repeated.

The previously described prior art sputtering system is not practical if large numbers of substrates are coated. It has been supplemented with a more automated substrate handling system used in conjunction with a cathode assembly constructed in accordance with the present invention. Silicon wafers constitute the substrate in such a system. They are loaded onto a wafer cassette and individually extracted from the cassette by a wafer handling arm and then moved to a wafer platen.

At the platen site, the wafer is clamped to hold it in contact with the platen, and the platen rotated 90° about a pivot axis toward a chamber 100. (See FIG. 2). This rotation places the wafer in a vertical attitude, and thrusts it into the process chamber 100. The wafer holding platen creates a vacuum seal with the interior wall of the chamber 100. The wafer is thereby vacuum isolated in a separately pumped process chamber. Since the process chamber 100 is a coating chamber, a sputter cathode has a consumable target 112 that is mounted to an opposite wall of the process chamber 100 for sputter coating of the wafer.

Upon completion of the coating process a reverse 90° motion of the platen allows removal of a wafer from the platen and transfer to another processing station. The wafer may be transferred through a series of isolated process chambers thereby permitting the accomplishment of a preparatory etch step followed by the deposition of multiple sputter coating layers.

The pivoting platen or platens at the process stations are equipped with necessary power supply connections, heaters, and cooling means needed to achieve bias sputter deposition at controlled substrate temperatures. Also, the vacuum isolation of individual process chambers permits the use of reactive sputtering in one process chamber, and normal sputtering in an adjacent chamber without the flow of the reactive gas between chambers. Similarly, the use of a reactive gas is permitted during the etch step without interchamber cross-contamination.

A representative process chamber 100 is depicted in FIG. 2. The chamber 100 is separated from a central staging chamber 100A by a wall 101 that defines a generally circular opening 102. A wafer substrate 104 clamped to a platen rotates upward from the staging chamber to the generally vertical orientation shown in FIG. 2 with a surface 104a to be coated facing away from the staging chamber.

For the use shown in FIG. 2, a concave target 112 that faces the wafer 104 and bounds the chamber 100 deposits a uniform aluminum layer onto the circular silicon wafer 104. For ease in manufacture, the target 112 can be constructed from two target segments which are separately fabricated and then coupled to a target support 120 in abutting relationship. Alternately, the target 112 may be of a single piece construction.

The section view of the target 12 in FIG. 2 shows the target before target erosion. An inner portion 112a of the target has a generally planar base that sweeps outward at its outer periphery along an arc toward the wafer 104. A second target portion 112b also initially defines a generally planar surface that forms an angle of approximately 45° with the plane of the wafer 104.

The support 120 is preferably copper and both supports the target and biases it at a negative electric potential of about −400 volts d.c. A circular anode 130 spaced away from the inner target portion 112a, is maintained at a ground potential. A number of ferromagnetic pole pieces 140-146 are coupled to the copper target support 120. These pole pieces 140-146 are preferably constructed from iron and help define a magnetic field used in focusing ionization electrons in the space between the substrate 104 and the target.

Two separately energizable current carrying coils 150, 152 are supported within a region bounded by the pole pieces 140-146 and the target support 120. By controlling the current passing through these coils, it is possible to shape and define a magnetic field for concentrating ionization electrons in the gas discharge region between the target 112 and wafer substrate 104. By concentrating the location of ionization electrons between the two target portions 112a, 112b and the substrate 104 the areas of high concentration of target erosion (racetracks) can be controlled.

A metal shield 132 (preferably an aluminum alloy) encircles the target 112 and is grounded by virtue of connection to a grounded process chamber housing 134. The shield 132 overlaps the pole piece 140 and helps prevent stray ion bombardment of the pole piece 140 which could contaminate the sputtered deposited coating.

The plurality of magnet pole pieces 140-146, the target 112, the anode 130, the shield 132, and the substrate 104 all have cylindrical symmetry about a center axis 154 passing through a center of the anode 130.

To illustrate energization of the two coils 150, 152 and the effect energization has on the concentration of ionization electrons, the FIG. 2 target 112 has been schematically depicted in FIGS. 3-5 wherein field lines 156 created by selective coil energization are shown passing through a target sputtering surface. The effect of the individual magnetic field pole pieces 140-146 has been lumped together and labeled pole 1, pole 2, and pole 3 in these figures.

By varying the coil currents and polarities through the two field creating coils 150, 152 the regions of concentrated emission from the target can be controlled as can the intensity of those emissions.

In FIG. 3, the d.c. current in the two coils 150, 152 flows in opposite directions. As seen from an observing position within the chamber 100, the current in the outer coil 152 flows in a counter-clockwise 10 direction. The current in the inner coil 150 flows in a clockwise direction. The resulting magnetization in the pole pieces 140-146 produces a magnetic field adjacent the target 112 as shown in FIG. 3. As is known in the art, the regions of magnetic discharge are concentrated in those regions where the magnetic field lines are approximately parallel to the sputter target 112. Two annular magnetic regions of parallel lines of force at distances $R_1$, $R_2$ from the center axis 154 result. These energization patterns produce two separate areas of concentrated magnetic discharge on the target surface at radial distances $R_1$ and $R_2$. But for the ability to change the coil energization and re-distribute the magnetic field lines in relation to the target, deep, V-shaped grooves would develop along these racetrack regions resulting in inefficient utilization of target material and a significantly altered deposition pattern.

FIG. 4 illustrates a different coil energization to produce a different magnetic field in the region between the concave sputter surface target 112 and the substrate position. This magnetic field corresponds to a situation in which the outermost coil 152 is deenergized and the magnetic field is created by energization of the inner coil 150 in a clockwise sense as viewed from the chamber 100.

The position where magnetic field lines are parallel to the target face is shifted outward to a radius $R_3$. In addition, the magnetic field lines are less arched. Thus, the racetrack on inner, planar target portion 112a is broadened and moved radially outward. The magnetic field adjacent to outer, inclined target portion 112b, is inappropriately shaped to maintain a magnetron discharge over target portion 112a. For a cathode maintained at a constant discharge power, the consequence of deactivating coil 152 is therefore to transition from the two racetrack sputter emission of FIG. 3, to a single racetrack emission at radial position $R_3$. A better understanding of the details of this transition may be obtained by reference to FIG. 6, which shows thickness profiles of sputter coating of aluminum film deposited on a 7.5 cm radius wafer achieved under a variety of different coil current activation states representative of the transition from that depicted in FIG. 3, to that depicted in FIG. 4.

While the terms "clockwise" and "counter clockwise" are used above to describe coil activation, the relation can be reversed i.e., the counter clockwise activation could be clockwise and the clockwise activation could be counter clockwise. The important concept is whether the 25 coil energization is of the same polarity or it is reversed.

Figure 6:
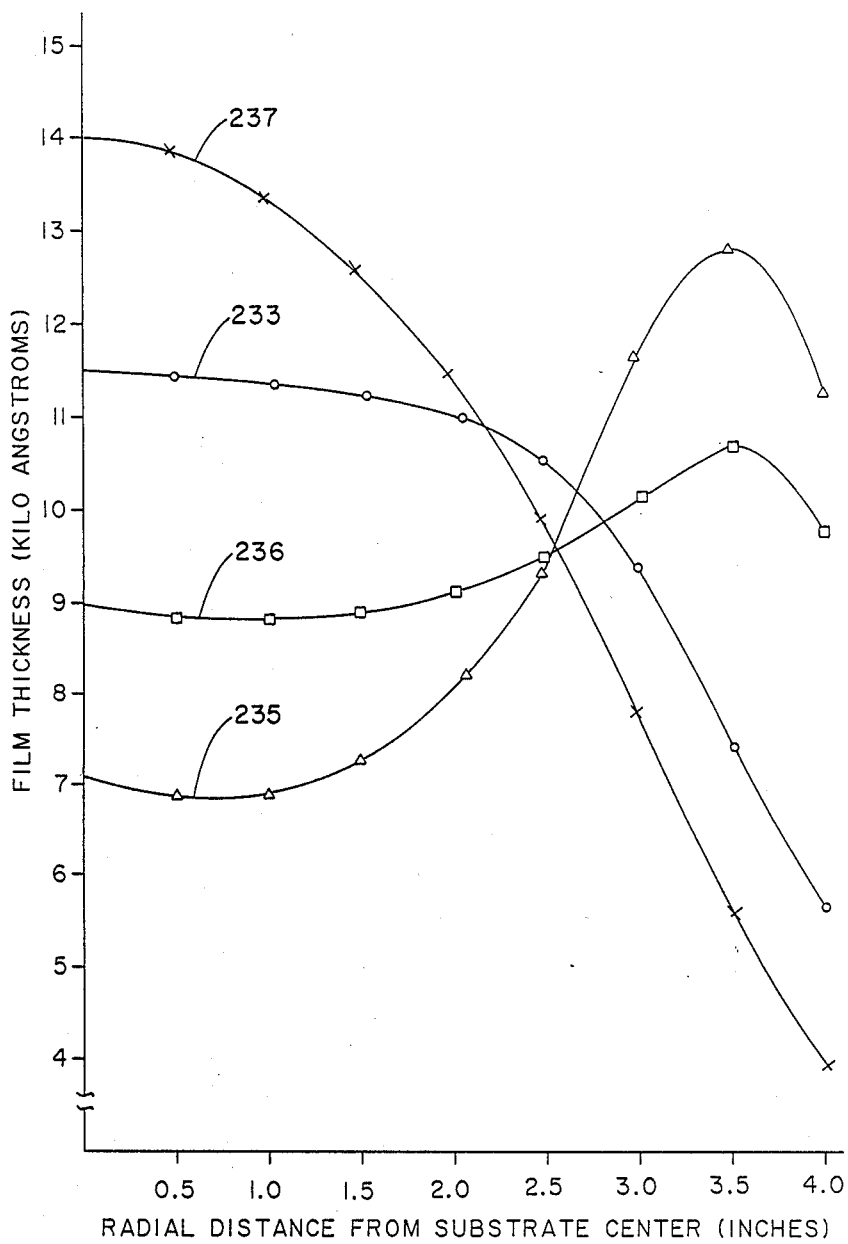
FIG. 6 is a graph showing thicknesses of sputter deposited aluminum achieved under different magnet coil current activation states.

The deposition profiles depicted in FIG. 6 were all obtained with an applied cathode power of five kilowatts, an argon sputtering pressure of five millitorr, a deposition time of one minute, and the substrate 104 positioned 1.6 cm ("S" in FIG. 2) beyond the outer rim of bowl-shaped target 112. The polarity of current flowing in outer coil 152 was opposite to that of inner coil 150.

Deposition profile 235 was generated with an outer coil 152 current of 6.5 amperes and an inner coil 150 current of 15 amperes. Discharge current measurements made at anode 130 and outer shield 132 indicated that only 35 watts was dissipated at the inner planar target portion 112a, and 4965 watts dissipated at the inclined outer target portion 112b. The expected saddle shaped deposition profile is obtained since $RR=R_s$ and spacing is approximately, 0.125 $R_R$.

For deposition profile 236, outer coil 152 current was 5.0 amperes and inner coil 150 current was 15 amperes. Here, the power to the outer target portion 112b was 3655 watts, and to inner target portion 112a, 1345 watts. A view of the operating cathode shows dual racetrack magnetron discharges.

Profile 237 was obtained with a outer coil 152 current of 2 amperes and an inner coil 150 current of 15 amperes. The power to outer target portion 112b was 750 watts, and inner target portion 112a, was 4250 watts. A view of the operating cathode shows one narrow racetrack on inner target portion 112a very close to anode 130.

Finally, deposition profile 233, was obtained with outer coil 152 deactivated, and inner coil 150 at 15 amperes. The power dissipated at inner target segment is 5000 watts and the racetrack is broad and outwardly displaced relative to the deposition run which yielded profile 237.

Thus, the gradual reduction of current in outer coil 152 while maintaining the current on inner coil constant, and of opposite polarity, causes a transfer of discharge power to inner target portion, and a concomitant broadening and outward radial movement of the inner magnetron racetrack. This action causes a beneficial broadening of the erosion groove which develops on the face of inner target portion 112a. It has been similarly shown that the gradual reduction of current to inner coil 150, while maintaining current to outer coil 152 constant and of opposite polarity, causes a transfer of discharge power from the inner target portion 112a to outer target portion 112b, with a concomitant broadening and inward radial movement of the outer magnetron racetrack. This action causes a beneficial broadening of the erosion groove which develops on the face of outer target portion 112b.

Figure 7:
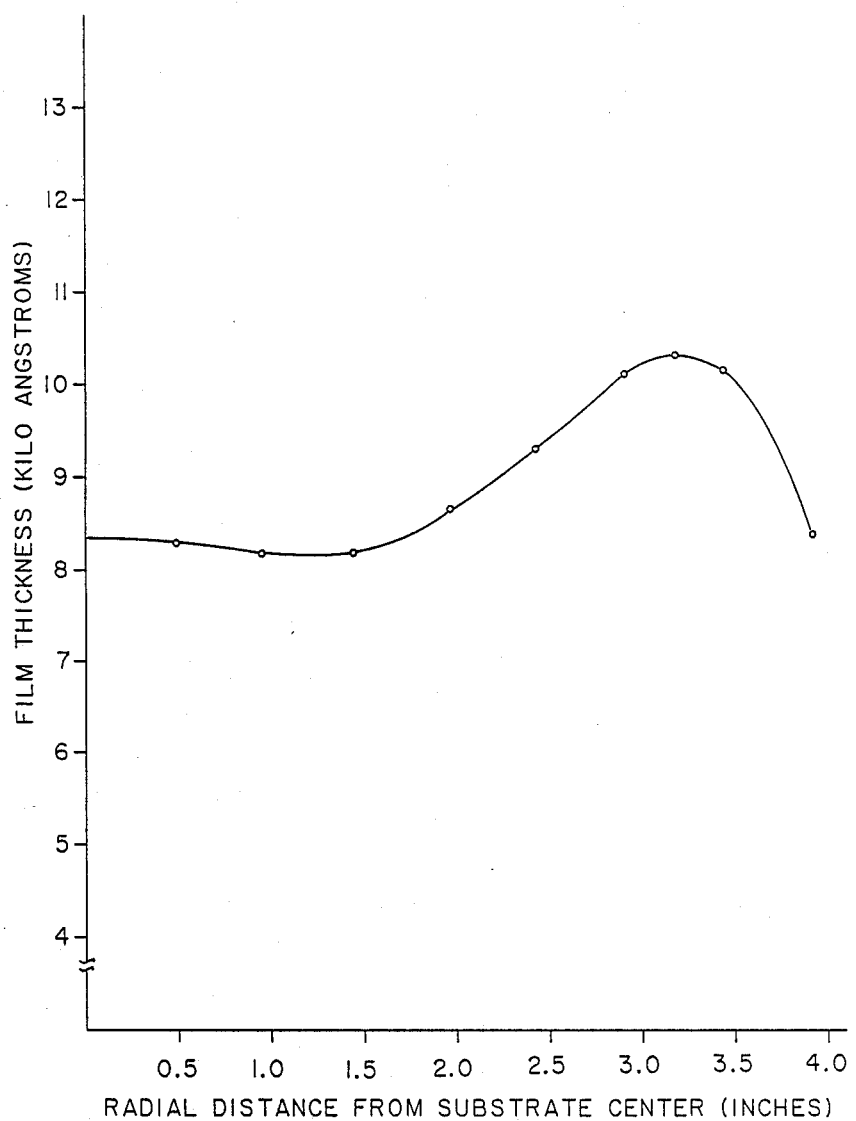
FIG. 7 is a graph showing sputter thickness versus radial position on a substrate that exhibits an unacceptable non-uniformity in coating.

When the coil currents of inner and outer coils 150 and 152 are of reverse polarity, there is always an addition of the coil fluxes in the intermediate pole piece, pole 2 of FIGS. 3, 4 and 5. This causes pole 2 to be magnetically active, and causes the separation of the two magnetron discharges. Pole 2 further acts to repel each of the discharges, causing the inner magnetron discharge to be pushed radially inward, and the outer magnetron discharge to be pushed radially outward. No sputtering therefore ensues from the annular target region adjacent to pole 2. With this coil current polarity, the magnetic configuration is similar to the magnetic configurations disclosed in the U.S. Pat. Nos. 4,627,904; 4,604,180; 4,606,806; 4,595,482, 4,569,746; and 4,622,121, and differs from these in the means of providing racetrack movement and power distribution. As a matter of fact, this cathode can be operated in this mode, and with the 5:1 power split referenced in U.S. Pat. No. 4,627,904 gives the deposition profile shown in FIG. 7. The deposition conditions were as before, i.e., deposition power, five kilowatts; substrate spacing "S", 1.6 cm; and sputtering pressure, five millitorr. The familiar saddle-shaped deposition profile clearly shows that operation in this mode does not yield an acceptably uniform deposition profile at the unconventionally close placement of the substrate to the cathode.

Recalling the foregoing, reference to FIG. 5 shows one magnetic field configuration where currents in coils 152 and 150 are of like polarity, such as both clockwise as depicted in FIG. 5. Under these conditions, the magnetic fluxes from the two coils are subtractive in pole two and at the proper relative coil current magnitudes, the magnetic flux in pole two becomes null. The magnetic field configuration shown in FIG. 5 ensues. Here the magnetron discharge is very broad, and is centered in the annular target region immediately adjacent to pole 2, a region which was not subject to ion bombardment and sputter emission of target material in prior art systems.

Figure 8:
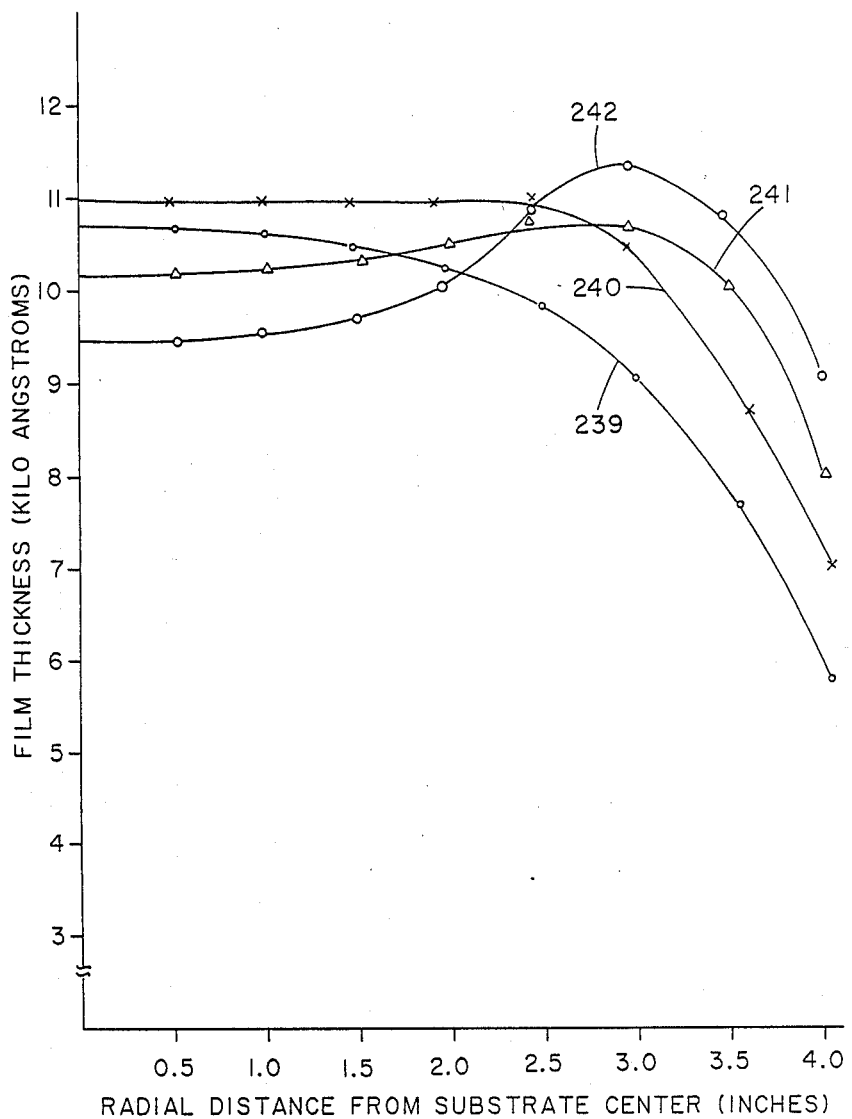
FIG. 8 is a graph of different coating profiles resulting from the FIG. 5 coil energization scheme.

The nature of the deposition profiles achievable with such a magnetic field configuration are shown in FIG. 8. Here, the deposition conditions were as before i.e., deposition power, five kilowatts; deposition pressure, five millitorr; substrate spacing, 1.6 cm. Deposition profile 239 was obtained with 15 amperes applied to inner coil 150 and no current on outer coil 152. It therefore reproduces the deposition profile 238 of FIG. 6. Deposition profile 240 was obtained with 15 amperes applied to inner coil 150 and 0.85 amperes applied to outer coil 152. Deposition profiles 241 and 242 were obtained with the same 15 amperes applied to inner coil 150 and respectively 1.7 amperes and 2.5 amperes applied to the outer coil 152. The outer coil current was of the same polarity as the inner coil current in all cases. The operating cathode showed a broad racetrack that gradually traversed the regions between inner target portion 112a and outer target portion 112b moving progressively outward as the current in coil 152 was increased.

From the foregoing, it is evident that by appropriate programmed manipulation of the currents in coils 150 and 152, during which both the relative magnitude and current polarity is varied, one may obtain a deposition profile which is uniform, allows for broad sputtering from target portions 112a and 112b, including the transition region between the target base portion 112a and the inclined wall portion 112b over intermediate poles 144, 145, and allows for an unconventionally broad angular arrival range of sputtered atoms at the substrate. Deposition profile uniformities of +1.5% have been achieved on a deposition zone 15 cm in diameter, and deposition rates of 11 kiloangstroms per minute achieved at an applied power of five kilowatts.

Figure 9:
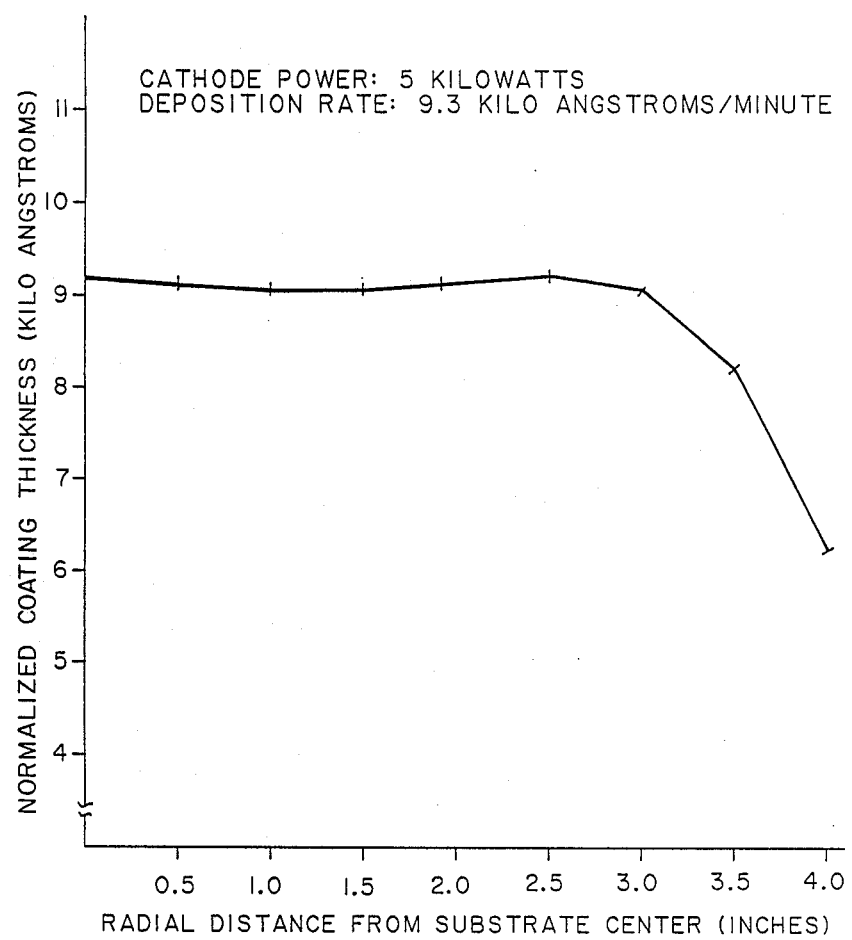
FIG. 9 is a graph showing coating uniformity on a substrate achieved by a controlled sequence of coil energization.

FIG. 9 shows one such controlled substrate coating profile. Current in the inner coil 150 was a constant 15 amperes while the current through the outer coil 152 was varied for controlled time periods. The current was maintained at 6.8 amperes in the same sense as the coil 150 for 0.34 minutes, then reduced to a current of 1.7 amperes in the same sense as the coil 150 form 0.49 minutes, then reduced to no current for a period of one minute. Current through the coil 152 was then changed to an opposite polarity from that in the coil 150 at a strength of 5 amperes for 0.39 minutes and then increased to a current of 6.5 amperes, opposite to the sense of the coil 150 for 0.33 minutes. The cathode power was five kilowatts and the thickness profile of FIG. 9 normalized to a one minute total deposition time.

For these devices rate is directly proportional to applied power. This permits an efficiency comparison with the cathode revealed in U.S. Pat. No. 4,457,825 which, as discussed earlier yields an aluminum deposition rate of 1800 angstroms per minute at an applied power of 1.56 kilowatts. The rate per unit power is 1.9 times greater for the present cathode. Based upon the reported transfer efficiency of the U.S. Pat. No. 4,457,825 cathode of 21.9%, the present cathode yields a 41.6% transfer efficiency.

Returning to FIG. 2 the target 112 has a bowl-like shape upon which a multitude of magnetron racetracks of different radii are created by the appropriate choice of coil current magnitude and polarity. The spacing between the substrate 104 and the rim of the target 112 "S" is less than prior art magnetron sputter coating systems. Any non-uniformities resulting from this close spacing between the substrate 104 and the target 12 are reduced by selective coil energization which can concomitantly produce a controlled target utilization and thereby provide more uniform substrate coating as well as more uniform target erosion.

As noted previously, the chamber 100 is evacuated and argon gas in controlled concentrations is introduced into the chamber 100 to provide ionizable atoms for the sputter coating process. The target support 120 is symmetric about the center axis 154 and coupled to a wall 160 of the process chamber by threaded connectors 162. An insulating ring 164 spaces the support 120 from the housing wall 160. This allows the support 120 to be at the same potential as the target 112, approximately minus 400 volts DC. The shield 132 is at ground potential and therefore directly coupled to the housing 134 by connectors 166. To allow the chamber 100 to be evacuated by a vacuum pump (not shown) "O" rings are positioned within grooves defined by the housing 134, the chamber wall 160, and the target support 120.

During ion bombardment of the target 112, the temperature of the cathode assembly depicted in FIG. 2 becomes elevated. The support 120 for the target is cooled by routing a fluid through two conduits 180, 181 to inner and outer fluid manifolds 182, 183 that define fluid delivery passageways 182a, 183a. Both manifolds 182, 183 engage a generally planar outer surface of the target support 120 ad are coupled to the support 120 in concentric relation around the axis 154 by threaded connectors passing through the manifolds 182, 183 into the target support 120. Two annular passageways 190, 192 are machined in the target support 120 and allow coolant delivered to the manifold 183 by the conduit 181 to contact a greater surface area of the support 120.

A second coolant delivery conduit 210 routes water to the vicinity of the grounded anode 130. The conduit 210 is coupled to an anode support 212. The ferromagnetic pole piece 143 defines a center passage to accommodate both the anode support 212 and an electrically insulating spacer 220. Water is routed through the conduit 210 to a T-fitting 222 that engages the support 212. Metal "O" rings supported within grooves in the support 212 and pole piece 143 maintain pressure separation between the outside of the chamber 100 and the surface engagement between the pole piece 143, the insulator 220, and the support 212.

The target 112 is held in place by a clamp ring 230 that overlaps the inner target portion 112a and is physically connected to the pole piece 146 by threaded connectors (not shown). The outer portion of the target is held in place by 3 clips 232 spaced at equal increments around the target outer periphery(see FIG. 2A) which overlap the target and are connected to the pole piece 140 by threaded connectors 234. Replacement of the target at periodic intervals as the target erodes requires that the anode 130 be removed and the clamp 230 separated from the pole piece 146. In addition, the three clips 232 coupled to the pole piece 140 are disconnected to allow the target to be lifted away from the target support 120.

FIGS. 11 and 12 are elevation and section views of a metal spool 250 supporting the coil 150 in concentrical relation about the center axis 154. The spool 250 is supported in a cavity defined by the pole pieces 142, 143, 144 and the manifold 182. Energization inputs 260, 262 are coupled to the coil 150 through an opening 264 in the spool 250. The sense of coil energization can be controlled by controlling the input voltage to these inputs 260, 262.

The spool 250 defines slots 270, 272 (FIG. 11) for receiving a fluid conduit 274 that cools the coil 150. The conduit 274 enters the spool 250 and is bent to form a tortuous path which winds back and forth along an outer coil surface 150a to encircle most of the coil circumference. The coil 150 is a multi-turn insulated conductor. A similar outer coil 152 is also supported by a spool (not shown) that is positioned within a cavity bounded by the pole pieces 141, 142, 144 and the manifold 183. This second coil 152 is also cooled by a conduit which enters the second spool and contacts an outer surface of the coil 152.

The cathode disclosed here consists of a non-planar bowl-shaped target and a magnetic structure consisting of three poles and two coils, with the two coils sharing a common pole. It is noted that this concept may be extended to structures having any number of coils which are adjacently disposed and share a common pole piece. When the two coils have currents of opposite polarity, the common pole piece is magnetized and causes the formation of two magnetron racetracks. When the adjacent coils have like polarity, the shared pole becomes magnetically inactive, causing a single magnetron racetrack to be formed over the now inactive pole piece. Thus, a programmed sequence of current magnitude and polarity reversal will cause multiple racetracks to be traversed over a target surface, thereby permitting programmed control of target sputter erosion and deposition profile.

Figure 10:
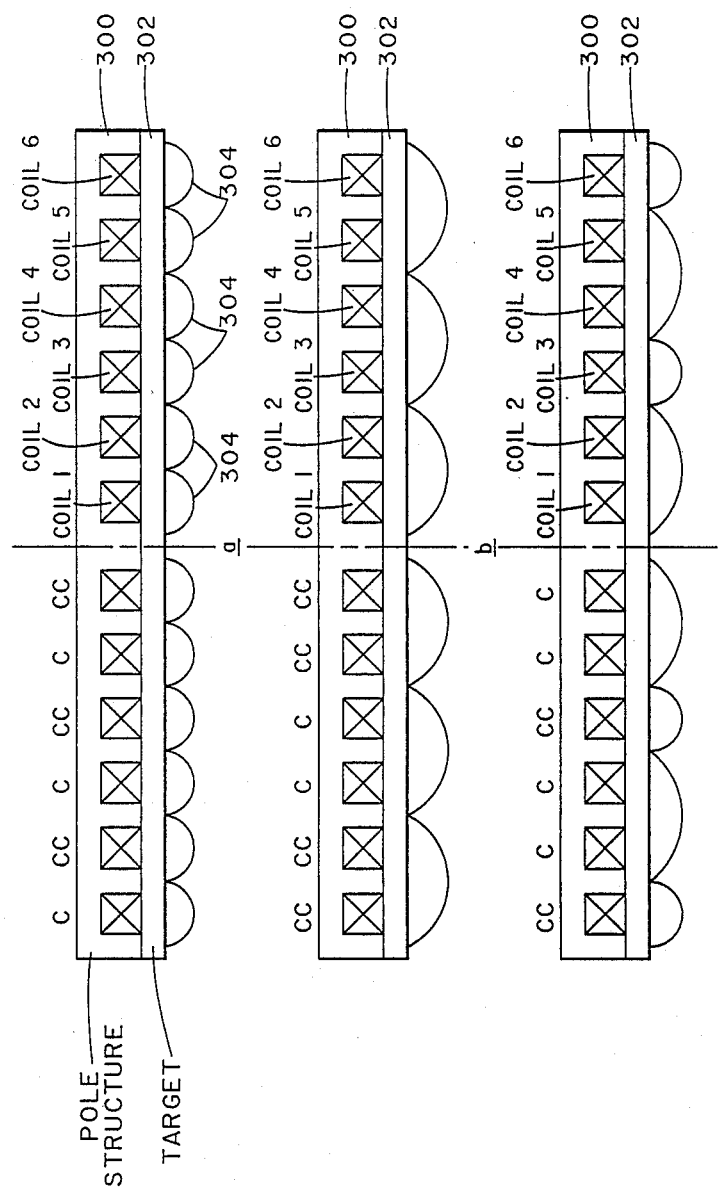
FIG. 10 shows a coil energization arrangement wherein more than two coils are independently activated to control racetrack formation.

FIG. 10, for example, shows in cross section, a pole-piece structure 300 having annular groove into which are placed 6 coils, all positioned behind a planar target 302. Three different configurations are shown with "C" indicating a clockwise coil current and "CC" a counter clockwise coil current. The resulting arch shaped magnetic fields 304 define annular magnetron racetracks on the target face. In FIG. 9a there are 6 racetracks in FIG. 9b there are three racetracks, and in FIG. 9c there are four racetracks. The different racetrack states are achieved by selective reversal of coil current polarity.

The invention has been described with a degree of particularity. It is the intent however, that the invention include all modifications and alterations from preferred embodiment falling within the spirit or scope of the appended claims.

We claim:

1. Sputter coating apparatus comprising:
   (a) means for supporting a generally circular substrate at a coating position;
   (b) target means comprising a coating material for coating the substrate, said target means fixed with respect to said substrate and having a concave sputter surface of coating material facing the generally circular substrate that includes a generally circular flat inner portion bounded around an outer periphery by a wall portion inclined toward the substrate;

(c) means for providing ions in a region between the target and the substrate;

(d) accelerating means for accelerating ions in the region between the target and the substrate causing the ions to impact the target and eject coating material from said sputtering surface to coat the substrate; and (e) field generating means for creating a magnetic field in the region between the target and the substrate to localize ionization of gas molecules by electrons in said region, said field generating means including two or more current carrying coils symmetric about an axis that intersects the substrate and the target, means for individually controlling both the polarity and magnitude of current flow through each of said current carrying coils and further including a center ferromagnetic pole piece coaxial with a centerline passing through the circular flat inner portion of said target and two or more annular ferromagnetic pole pieces that are spaced from each other by said two or more current carrying coils; wherein some of said pole pieces are shared by adjacent coils so that controlled energization of the coils of specified polarity and magnitude both increases and decreases magnetization of the shared pole pieces to control target erosion of the vicinity of said shared pole pieces; said controlled energization simultaneously producing and scanning distinct target erosion rings on the inner and wall portions of said target when adjacent coils are energized with an opposite polarity and a single widened ring extending radially outward toward the inclined region of said target if said two or more coils are energized with the same polarity or only one of said coils is energized.

2. The sputter coating apparatus of claim 1 wherein the flat inner portion of said target is generally parallel to the substrate.

3. The sputter coating apparatus of claim 2 wherein the distance between the surface of said flat inner portion of said target and the substrate is less than the diameter of the circular substrate.

4. The apparatus of claim 1 wherein the spacing between two adjacent ferromagnetic pole pieces is approximately the same for each pair of said pole pieces.

5. The apparatus of claim 1 further comprising a center anode maintained at an electric potential different from the target and support means for supporting the center anode within a region between the flat inner portion of the target and the substrate.

6. The apparatus of claim 5 wherein the inner flat portion of the target defines a center opening to accommodate passage of the support means for supporting the center anode.

7. The apparatus of claim 5 further comprising a metal shield overlying an outermost pole piece and maintained at the same electric potential as the center anode.

8. Magnetron sputter coating apparatus for treating a generally flat, generally circular substrate said apparatus comprising:

a concave consumable target including first and second target portions, said first target portion defining a circularly symmetric inner target base aligned generally parallel to a substrate surface to be treated and having an aperture passing through said base at or near the center of said base, and bounded by said second target portion which includes a circularly symmetric annular outer target surface facing toward the substrate at an angle;

a target support for fixing the target in relation to a center axis which intersects a center of the substrate and for biasing the target with a target voltage to attract ions toward the target;

a circularly symmetric center anode spaced from said inner target portion in a gas discharge region between the first target portion of said consumable target and the substrate and maintained at an anode voltage different than said target voltage to create an electric field in the gas discharge region for attracting said ions to said target;

anode support means extending through the aperture in the base to bias the center anode at said anode voltage;

clamping means to secure the target to the target support;

a plurality of magnetic pole pieces fixed with respect to the target to help define a magnetic field in a region between the target and the substrate; and two or more separately controllable current carrying coils fixed with respect to the target, wound concentrically about the center axis, and spaced apart by shared magnetic pole pieces for controllably modifying the magnetic field in the region between the target and the substrate to concentrate and radially scan ion formation at spaced apart regions to cause target erosion from the first and second target portions as well as a transition region between said first and second target portions depending upon the magnitude and polarity of coil energization.

9. The magnetron sputter coating apparatus of claim 8 where said first and second target portions are bridged by a concave arcuate transition portion that slopes toward said substrate.

10. The magnetron sputter coating apparatus of claim 9 wherein said first and second target portions define generally annular contact surfaces having a thickness less than the thickness of said first and second target portions in racetrack regions of increased target erosion.

11. A method for sputter coating a generally circular, planar substrate with a target material comprising the steps of:

(a) positioning a concave target having a generally planar inner base and radially outer inclined walls in proximity to the substrate so that said substrate is generally parallel to the generally planar base of the target;

(b) positioning a plurality of electro-magnetic pole pieces in symmetric relation to an axis that intersects both the target and the substrate;

(c) positioning two or more electro-magnetic coils concentrically around the axis to modify the magnetic field in a region between the substrate and the target;

(d) establishing an electric field in a region between the substrate and the target to cause ions in said region to bombard said target; and (e) adjusting the polarity and magnitude of current in said two or more electro-magnetic coils to cause said ions to bombard said target in multiple concentrated circular regions spaced from each other about said axis, said coil energization causing the concentrated regions to move radially inward and outward along the base and inclined walls of said target to erode said target not only along the base and inclined walls but in a transition region between the base and the inclined walls.

12. The method of claim 11 wherein the coils are energized in the same sense and in opposite senses during the adjusting step.

* * * * *